(12) United States Patent
Nishikawa et al.

(10) Patent No.: US 9,431,065 B2
(45) Date of Patent: Aug. 30, 2016

(54) SEMICONDUCTOR INTEGRATED CIRCUIT

(71) Applicant: FUJI ELECTRIC CO., LTD., Kawasaki-shi (JP)

(72) Inventors: Mutsuo Nishikawa, Matsumoto (JP); Kazuhiro Matsunami, Matsumoto (JP); Yuko Fujimoto, Shiojiri (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/656,697

(22) Filed: Mar. 12, 2015

(65) Prior Publication Data
US 2015/0287439 A1 Oct. 8, 2015

(30) Foreign Application Priority Data

Apr. 4, 2014 (JP) ................. 2014-077602

(51) Int. Cl.
| | | |
|---|---|---|
| *G11C 11/36* | (2006.01) | |
| *G11C 5/06* | (2006.01) | |
| *G11C 7/00* | (2006.01) | |
| *G11C 7/24* | (2006.01) | |
| *G11C 16/06* | (2006.01) | |
| *G11C 16/10* | (2006.01) | |
| *G11C 16/12* | (2006.01) | |
| *G11C 16/22* | (2006.01) | |
| *G11C 16/30* | (2006.01) | |

(52) U.S. Cl.
CPC . *G11C 5/06* (2013.01); *G11C 7/00* (2013.01); *G11C 7/24* (2013.01); *G11C 16/06* (2013.01); *G11C 16/10* (2013.01); *G11C 16/12* (2013.01); *G11C 16/22* (2013.01); *G11C 16/30* (2013.01)

(58) Field of Classification Search
USPC ................................... 365/175, 72
See application file for complete search history.

(56) References Cited

U.S. PATENT DOCUMENTS 7,868,620 B2 * 1/2011 Moe et al. ........... G11B 19/041
                                                          324/452

FOREIGN PATENT DOCUMENTS

| JP | 2005-026307 A | 1/2005 |
| JP | 2009-231650 A | 10/2009 |
| JP | 2012-160611 A | 8/2012 |
| JP | 2012-209526 A | 10/2012 |

* cited by examiner

*Primary Examiner* — Vu Le
(74) *Attorney, Agent, or Firm* — Rabin & Berdo, P.C.

(57) ABSTRACT

A semiconductor integrated circuit that exhibits an enhanced surge withstand voltage of a nonvolatile memory and has a reduced chip area, having a nonvolatile memory and a Zener diode connected in parallel between a write terminal and a ground terminal. The nonvolatile memory is connected to the write terminal by a write terminal line and to a common connection point by a first ground line. The cathode of the Zener diode is connected to the write terminal line. The anode of the Zener diode is connected to the specified connection point by a second ground line. The first ground line and the second ground line are connected to the specified connection point.

7 Claims, 7 Drawing Sheets

SEMICONDUCTOR INTEGRATED CIRCUIT

CROSS-REFERENCE TO RELATED APPLICATION

This application is based on, and claims priority from, Japanese Patent Application No. 2014-077602, filed on Apr. 4, 2014, the contents of which are incorporated herein by reference.

BACKGROUND OF THE INVENTION

1. Field of the Invention

The present invention relates to a semiconductor integrated circuit

2. Description of the Related Art

Figure 6:
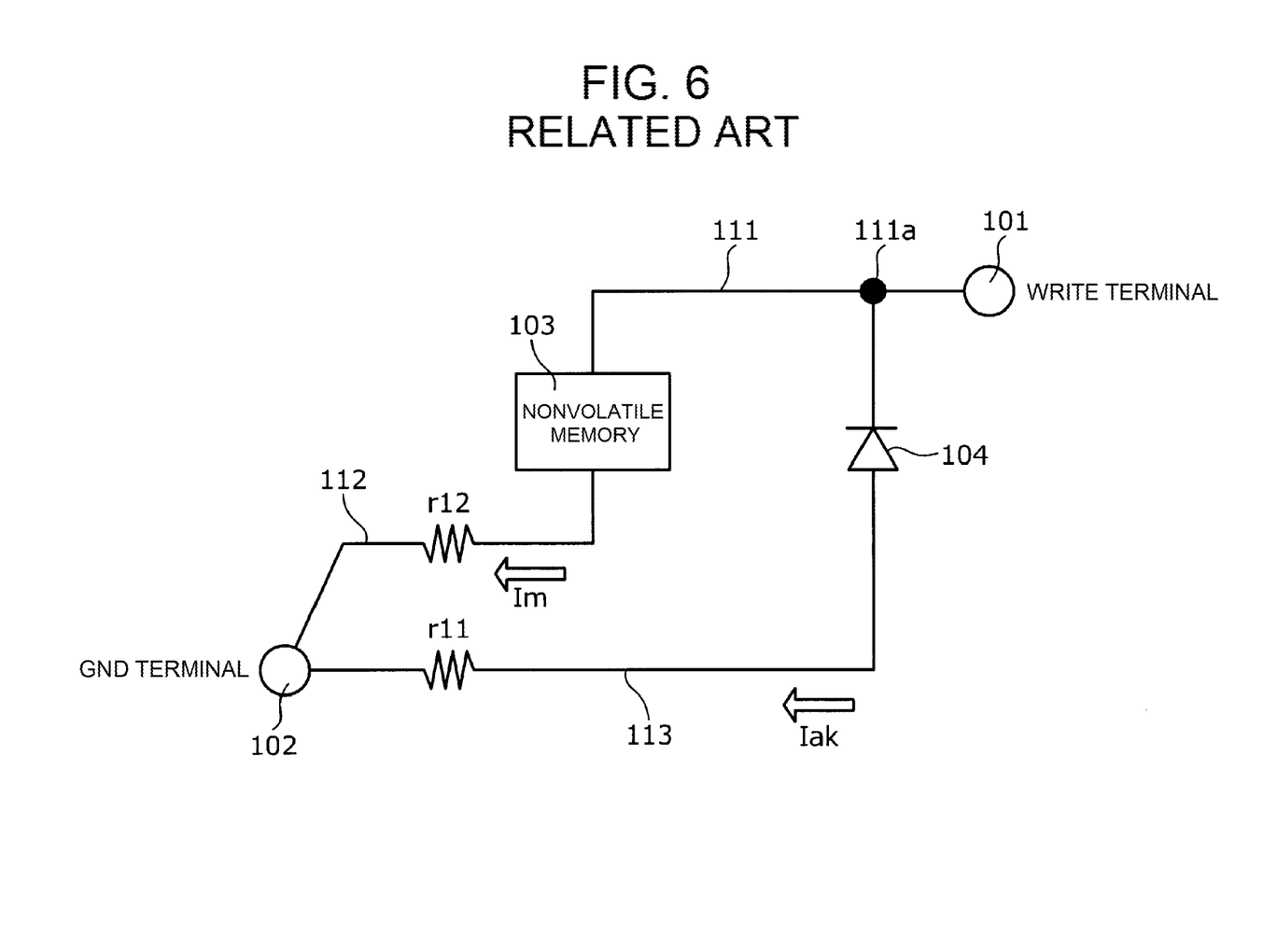
FIG. 6 is a circuit diagram showing a circuit construction of a semiconductor integrated circuit according to a conventional technology.
Figure 7:
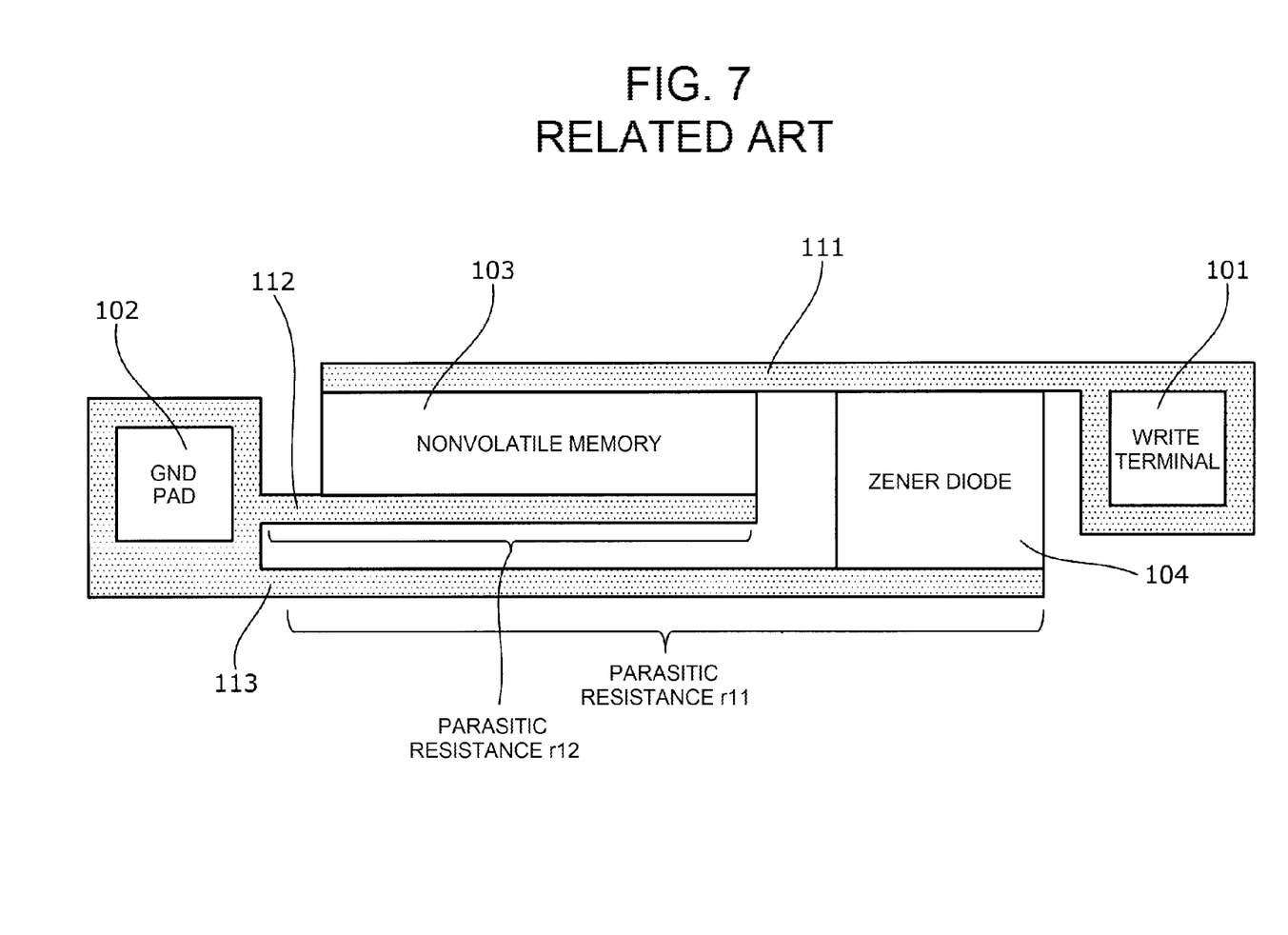
FIG. 7 is a plan view showing an example of an IC pattern corresponding to the semiconductor integrated circuit of FIG. 6.

Semiconductor integrated circuits (ICs) are known containing a nonvolatile memory such as an erasable programmable read only memory (EPROM) or an electrically erasable programmable read only memory (EEPROM) that are provided with a function for protecting the nonvolatile memory against an external surge voltage or an overvoltage. The following describes an example of surge protection circuit for a nonvolatile memory of such a conventional semiconductor integrated circuit. FIG. 6 is a circuit diagram showing a construction of a conventional semiconductor integrated circuit. FIG. 7 is a plan view showing an example of a pattern of the semiconductor IC of FIG. 6.

As shown in FIG. 6 and FIG. 7, a conventional semiconductor integrated circuit has a nonvolatile memory 103 and a Zener diode 104 for protecting the nonvolatile memory 103 connected in parallel between a write terminal 101 and a ground terminal 102 with independent wiring lines of a write terminal line 111, a first ground line 112, and a second ground line 113. The nonvolatile memory 103 is connected to the write terminal 101 with the write terminal line 111, and connected to the ground terminal 102, which is a ground pad, with the first ground line 112. The cathode of the Zener diode 104 is connected to the write terminal line 111 at a node 111a, and the anode of the Zener diode 104 is connected to the ground terminal 102 with the second ground line 113. The first ground line 112 has a parasitic resistance r12 and the second ground line 113 has a parasitic resistance r11.

Japanese Unexamined Patent Application Publication No. 2009-231650 discloses a semiconductor integrated circuit provided with a protecting function against a surge voltage, having a first diode and a p channel metal-oxide-semiconductor (MOS) transistor connected in series between a write terminal and a Vcc line, and having a second diode connected between the write terminal and a ground line. The p channel MOS transistor in the Japanese Unexamined Patent Application Publication No. 2009-231650 is formed in an n well diffusion region that is formed on a substrate of a p conductivity type. The n well diffusion region of the p channel MOS transistor is electrically independent, or floating, of other circuit component. This construction allows simultaneously ensuring an electrostatic withstand voltage and enabling a high voltage write terminal.

Japanese Unexamined Patent Application Publication No. 2005-026307 discloses another semiconductor integrated circuit, which has a first power supply line connected to a first external power supply terminal and a second power supply line connected to a second external power supply terminal. The first power supply line supplies an operation voltage to a first circuit and the second power supply line supplies an operation voltage to a second circuit. The first external power supply terminal and the second external power supply terminal have a protection circuit for electrostatic discharge (ESD) toward the corresponding power supply lines, and bridge circuits for ESD are arranged between the first power supply line and the second power supply line. The circuit of the Japanese Unexamined Patent Application Publication No. 2005-026307 restricts transmission of power supply noises, and enhances surge withstand voltage by transmitting the surge voltage applied on one side of the power supply terminal to the other power supply line through the bridge circuit for ESD.

Japanese Unexamined Patent Application Publication No. 2012-209526 discloses still another semiconductor integrated circuit that comprises: a nonvolatile memory, a write control line that receives a write voltage for the nonvolatile memory, a first node connected to the write control line, an external terminal connected to the first node through a switch, an ESD protection circuit connected to the external terminal without intervening the switch, and a control circuit for ON/OFF-controlling the switch corresponding to an operation mode. In the circuit of Japanese Unexamined Patent Application Publication No. 2012-209526, a switch is provided between the nonvolatile memory and a write terminal, which is the write control line. The switch is turned ON in a test mode for testing the characteristics of the nonvolatile memory, and turned OFF in a user mode for writing into the nonvolatile memory, thereby performing surge protection for the nonvolatile memory.

Japanese Unexamined Patent Application Publication No. 2012-160611 discloses a different semiconductor integrated circuit comprising: a ring of ground line along an outer periphery of a semiconductor substrate, and a ring of first power supply line inside the ground line. A ring of a second power supply line is provided inside the first power supply line. Inside the second power supply line, internal circuits including a nonvolatile memory are provided. Power supply cells are provided along the four sides of the first and second power supply lines and the ground line. The power supply cells include a power supply terminal and a protection circuit.

The circuit of Japanese Unexamined Patent Application Publication No. 2012-160611 comprises a protection circuit connected between the first power supply line and the ground line, the protection line releasing surge current influent to the first power supply line to the ground line, thereby performing surge protection of the internal circuit components.

In the conventional semiconductor integrated circuit as shown in FIG. 6 and FIG. 7, however, a breakdown current flows from the Zener diode 104 to the ground terminal 102 through the second ground line 113 when a surge voltage higher than the breakdown voltage Vr of the Zener diode 104 used for a protection device is applied. This breakdown current is an anode-cathode current Iak through the Zener diode 104 when a voltage Vak applied between the anode and cathode of the Zener diode 104 exceeds the breakdown voltage Vr of the Zener diode 104. The breakdown current Iak of the Zener diode 104 generally increases in proportion to the increment of the voltage $\Delta Vd$ applied between the ground terminal 102 and the write terminal 101. (See FIG. 3.)

Because of the characteristic of the Zener diode 104, a high surge voltage applied to the write terminal 101 increases the breakdown current Iak, which in turn results raises the voltage at the write terminal 101 due to the anode-cathode resistance Rvr, which is equal to $\Delta Vak/\Delta Iak$. Because the nonvolatile memory 103 is connected in parallel to the Zener diode 104, the raised voltage at the write terminal 101 is directly applied to the nonvolatile memory 103. Despite the surge protection by the Zener diode 104, the voltage rise at the write terminal 101 is hardly suppressed in the case of high surge voltage applied to the write terminal 101, which may impose a voltage higher than the surge withstand voltage, or surge breakdown voltage, Vbm on the nonvolatile memory 3, leading breakdown thereof.

The device in Japanese Unexamined Patent Application Publication No. 2009-231650 comprises protection devices of a diode and a p channel MOS transistor that exhibit a finite, nonzero resistance value proportional to the size of the device upon breakdown of the device elements. The resistances are a resistance between the anode and cathode of the diode, and a resistance between the source and drain of the p channel MOS transistor. Consequently, when a high external surge voltage is given, the terminal voltage surges up due to the resistance upon breakdown of the protective device element. Thus, there exists an upper limit in surge protection with the protective device elements, and a surge voltage exceeding this upper limit value may breakdown the nonvolatile memory. Enhancement of the upper limit value of surge protection with a protective device element is only achieved by increasing the size of the protection device. Thus, a tradeoff relationship exists between improvement of surge withstand voltage and reduction of the chip area.

In the device of Japanese Unexamined Patent Application Publication No. 2005-026307, the surge withstand voltage of the nonvolatile memory is improved with the protection device by transferring the surge voltage applied to the write terminal to the other terminal that is not relevant to the nonvolatile memory. Thus, the area occupied by the protecting device element is prevented from enlarging and the problem of chip area that was a problem in Japanese Unexamined Patent Application Publication No. 2009-231650 can be alleviated to some extent. On the other hand, the surge voltage transferred to a terminal irrelevant to the nonvolatile memory is transmitted also to the write terminal, which means many factors are left likely to cause the failure of the nonvolatile memory due to the surge. In the case the semiconductor integrated circuit is used under an environment of severe noise and unstable ground level potential, for example, on-board application in particular, the device construction of Japanese Unexamined Patent Application Publication No. 2005-026307, which includes a multiple of surge transmission paths, would increase the failure risk.

The voltage applied to the write terminal is generally higher than the voltage impressed on other integrated circuits. Thus, the construction of Japanese Unexamined Patent Application Publication No. 2012-209526 solves the problem that exists in the technologies in Japanese Unexamined Patent Application Publication No. 2009-231650 and Japanese Unexamined Patent Application Publication No. 2005-026307. However, the nonvolatile memory is isolated after writing into the nonvolatile memory. Thus, a noise possibly penetrates into the nonvolatile memory. In addition, a high withstand voltage is hardly achieved in a device produced by some manufacturing processes. Therefore the technology of Japanese Unexamined Patent Application Publication No. 2012-209526 has disadvantages of the need of a high withstand voltage device element for the switch to changeover connection between the nonvolatile memory and the write terminal, and the requirement for a costly manufacturing process to cope with avoiding the leak of surge current through a parasitic current path in the substrate.

SUMMARY OF THE INVENTION

It is therefore an object of the present invention to solve the above-described problems in conventional technologies and provide a semiconductor integrated circuit exhibiting an enhanced surge withstand voltage. Another object of the present invention is to solve the above-described problems in conventional technologies and provide a semiconductor integrated circuit having a reduced chip area.

To solve the above problems and achieve the object of the invention, a semiconductor integrated circuit of the invention comprises a write terminal to which a specified voltage is applied. The semiconductor integrated circuit comprises a ground terminal to which a ground potential is supplied. The semiconductor integrated circuit comprises a nonvolatile memory circuit that is connected between the write terminal and the ground terminal and stores a specified data by electric writing operation based on the specified voltage. The semiconductor integrated circuit comprises a protection device that is connected between the write terminal and the ground terminal in parallel with the memory circuit, and protects the memory circuit against an overvoltage. A first ground line connects the ground terminal and the memory circuit. A second ground line connects the ground terminal and the protection device. The first ground line and the second ground line include a common ground line from the ground terminal to a specified connection point. A parasitic resistance r1 of the common ground line has a resistance value that satisfies an inequality:

$$r1v > (Vd - Vbm)/Iak$$

where $r1v$ is a resistance value of the parasitic resistance r1, Vd is a voltage applied to the write terminal, Vbm is a breakdown voltage of the memory circuit, and Iak is a current that flows from the protection device to the second ground line when an overvoltage is applied to the write terminal.

The semiconductor integrated circuit is the semiconductor integrated circuit as stated above, wherein the parasitic resistance r1 of the common ground line has a resistance value that satisfies an inequality:

$$r1v > (Vd - Vbm - r2v \times Im)/(Iak + Im)$$

where Im is a current that flows from the memory circuit to the first ground line when an overvoltage is applied to the write terminal, and $r2v$ is a resistance value of a parasitic resistance r2 of a part of the first ground line from the memory circuit to the specified connection point.

The semiconductor integrated circuit is the semiconductor integrated circuit as stated above, wherein the parasitic resistance r1 of the common ground line has a resistance value that satisfies an inequality:

$$r1 < (Vd' - Vwm - r2 \times Im')/Im'$$

where Vd' is a write voltage for permitting writing operation into the memory circuit applied to the write terminal, Vwm is a voltage necessary to write into the memory circuit, and Im' is a current that flows from the memory circuit to the first ground line when the write voltage is applied to the write terminal, and r2 is a resistance value of a parasitic resistance from the memory circuit to the specified connection point.

The semiconductor integrated circuit is the semiconductor integrated circuit as stated above, wherein the parasitic resistance of the common ground line has a resistance value $r1v$ that satisfies an inequality:

$$r1v < (Vd' - Vwm - r2v \times Im')/(Iak' + Im')$$

where Iak' is a current that flows from the protection device to the second ground line when the write voltage is applied to the write terminal.

In the semiconductor integrated circuit of the invention, the voltage applied to the memory circuit when an overvoltage is applied to the write terminal has a magnitude of the overvoltage applied to the write terminal subtracted by the voltage drop developed across the common ground line. Thus, the voltage applied to the memory circuit is restricted, preventing the memory circuit from breakdown due to an overvoltage. In addition, the invention enhances the breakdown voltage with little increase in the area of a protection device and ground lines.

The present invention has an effect that a semiconductor integrated circuit of the invention enhances the surge withstand voltage of a nonvolatile memory. The present invention also has an effect that a semiconductor integrated circuit of the invention reduces the chip area.

DETAILED DESCRIPTION OF THE INVENTION

A preferred embodiment of the present invention will be described in detail in the following with reference to the accompanying drawings. In the description about the embodiment of the invention and in the accompanying drawings, the same structure is given the same symbol and repeated description thereon is omitted.

Embodiment Example

Figure 1:
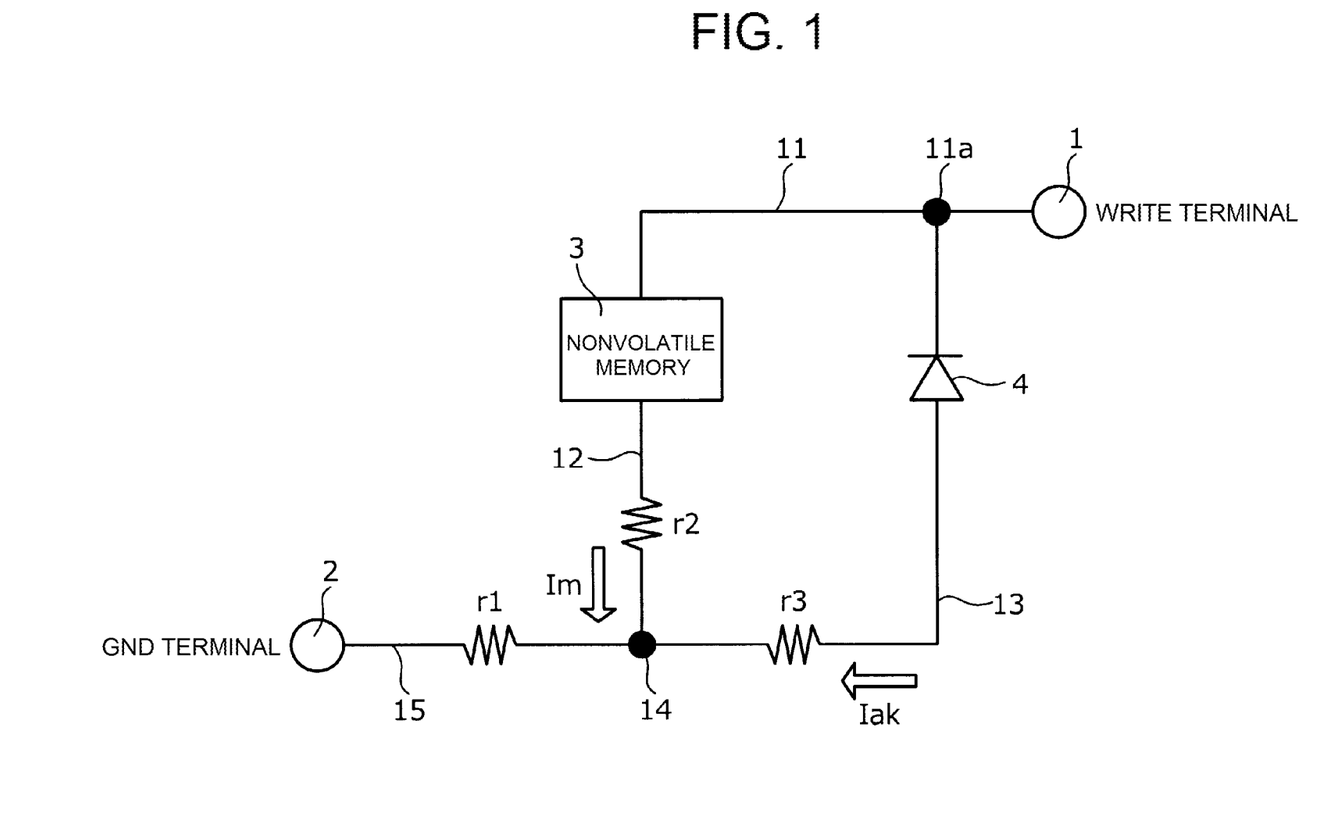
FIG. 1 is a circuit diagram showing circuit construction of a semiconductor integrated circuit according to an embodiment of the present invention.
Figure 2:
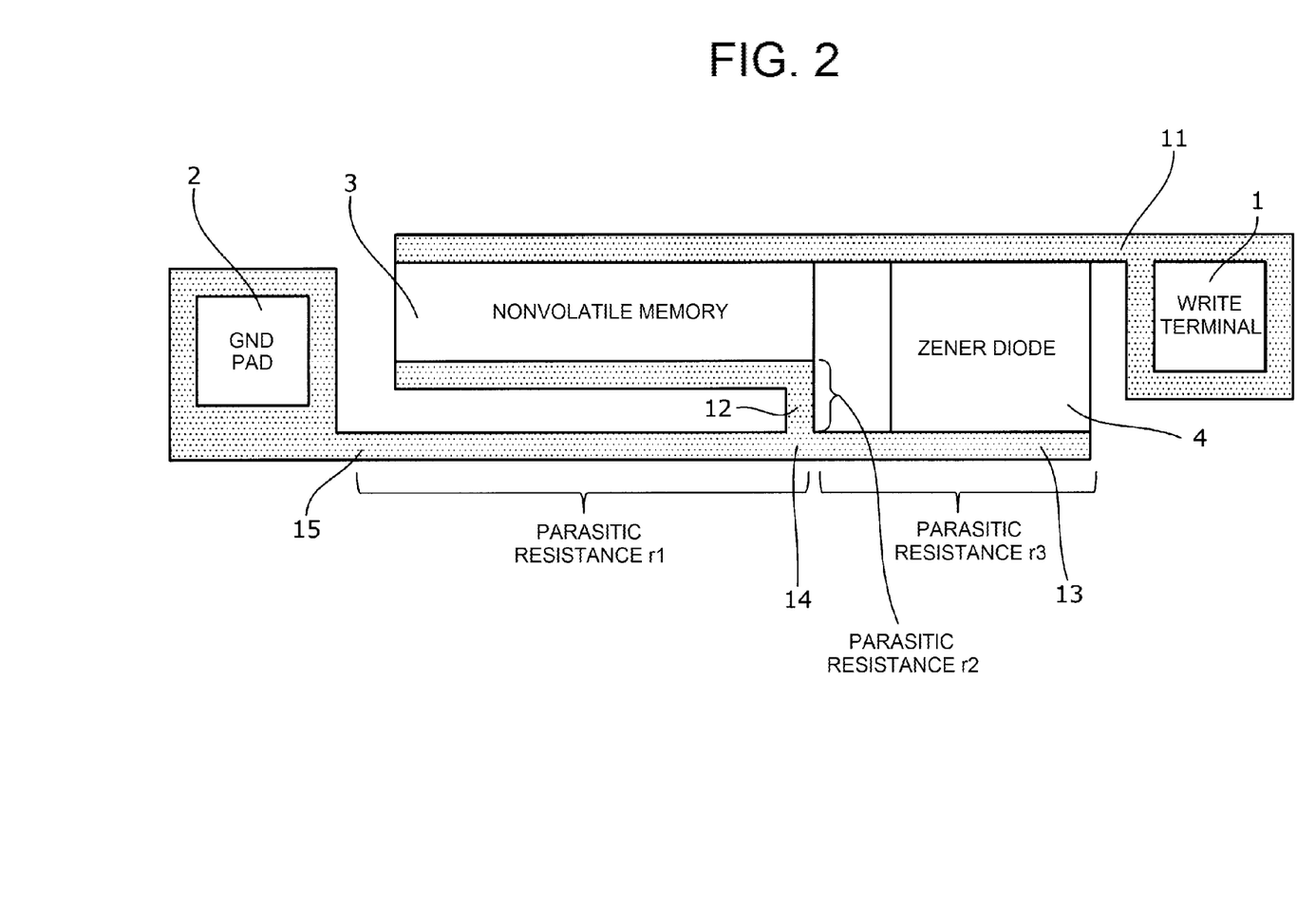
FIG. 2 is a plan view showing an example of an IC pattern of the semiconductor integrated circuit of FIG. 1.

Now, description will be made about the construction of a semiconductor integrated circuit according to an embodiment of the invention. FIG. 1 is a circuit diagram showing circuit construction of a semiconductor integrated circuit according to an embodiment of the present invention. FIG. 2 is a plan view showing an example of an IC pattern of the semiconductor integrated circuit of FIG. 1. In FIG. 2, and in FIG. 5, too, the hatched parts indicate electric wiring lines. As shown in FIG. 1 and FIG. 2, the semiconductor integrated circuit according to this embodiment of the invention comprises a nonvolatile memory 3 and a Zener diode 4 connected in parallel between a write terminal 1 and a ground terminal 2, which is a ground pad, with wiring lines of write terminal line 11, first ground line 12, and second ground line 13. The nonvolatile memory 3 is a memory circuit such as a PROM (programmable read only memory), an EPROM, or an EEPROM. The Zener diode 4 is a protection device for protecting the nonvolatile memory 3 against a surge voltage, or an overvoltage. The write terminal 1 is a terminal that receives a write voltage to permit write operation into the nonvolatile memory 3.

The nonvolatile memory 3 is connected to the write terminal 1 with the write terminal line 11 and to the ground terminal 2 with the first ground line 12. More specifically, the nonvolatile memory 3 is composed of a plurality of memory cells, each cell being a metal oxide semiconductor field effect transistor (MOSFET) storing one-bit data. The drain of each memory cell of the nonvolatile memory 3 is connected to the write terminal line 11. The cathode of the Zener diode 4 is connected to the write terminal line 11 at a connecting point 11a on the write terminal line 11. The anode of the Zener diode 4 is connected to the ground terminal 2 with the second ground line 13. The first ground line 12 that connects the nonvolatile memory 3 and the ground terminal 2 and the second ground line 13 that connects the Zener diode 4 and the ground terminal 2 have a common ground line 15 which is a part between the ground terminal 2 and a specified connection point 14 between the first ground line 12 and second ground line 13.

As shown in FIG. 2, the write terminal line 11 is arranged along the side face of the nonvolatile memory 3 and connected to every memory cells (not depicted in FIG. 2) of the nonvolatile memory 3. The first ground line 12 is arranged along the side surface of the nonvolatile memory 3 opposite to the write terminal line 11 and connected to every memory cells of the nonvolatile memory 3. The common ground line 15 has a parasitic resistance r1. The part of the first ground line 12 from the nonvolatile memory 3 at the memory cell nearest to the write terminal 1, for example, to the connection point 14 between the first ground line 12 and the second ground line 13 has a parasitic resistance r2. The part of the second ground line 13 from the Zener diode 4 to the connection point 14 between the first ground line 12 and the second ground line 13 has a parasitic resistance r3. The first ground line 12 and the second ground line 13, including the common ground line 15, can be a wiring line mainly composed of aluminum or a polysilicon wiring. The ground lines can also be diffusion resistors, for example, formed within the substrate in the case where each of the components of the semiconductor integrated circuit are isolated.

Figure 3:
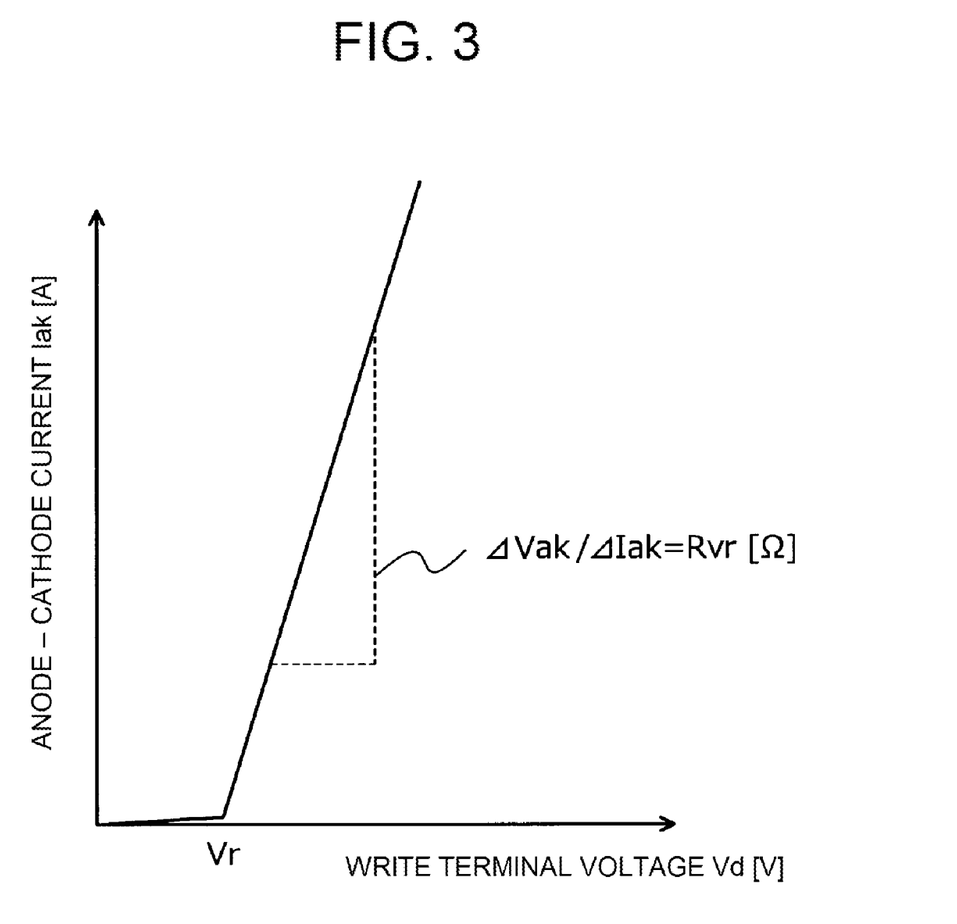
FIG. 3 shows a characteristic of a Zener diode used for a protective device element.

Now operation of the semiconductor integrated circuit according to the embodiment example of the invention when a surge voltage is applied will be described, with reference to FIG. 1 and FIG. 3. FIG. 3 shows a characteristic of a Zener diode used for a protective device element. When a voltage Vd, which is a surge voltage, exceeding voltage (Vr+r3v×Iak+r1v×(Im+Iak)) is applied to the write terminal 1, a breakdown current flows from the Zener diode 4 to the ground terminal 2. The breakdown current is the current Iak that flows between the anode and cathode of the Zener diode 4 when the voltage Vak applied between the anode and cathode of the Zener diode 4 exceeds the breakdown voltage Vr. As shown in FIG. 3, the voltage Vd at the write terminal 1 increases due to the effect of the characteristic of the Zener diode 4, which exhibits an anode-cathode resistance value Rvr=$\Delta$Vak/$\Delta$Iak.

The breakdown current Iak flowing from the Zener diode 4 to the ground terminal 2 generates a voltage drop V1 due to the parasitic resistance r1 in the common ground line 15, as represented by the formula (1) below. When a surge voltage is applied to the write terminal 1, a current Im flows from the nonvolatile memory 3 to the ground terminal 2. This current Im generates a voltage drop V2 due to the parasitic resistance r2 in the first ground line 12 as represented by the formula (2). As a result, the voltage V3 applied between the both terminals of the nonvolatile memory 3 becomes, as represented by the formula (3), a value equal to the voltage Vd applied to the write terminal 1, which is increased due to the effect of the surge voltage, subtracted by the sum of the two voltage drops V1 and V2. Thus, the rise up of the voltage V3 is restricted by the voltage drops V1 and V2 due to the parasitic resistances r1 and r2 of the common ground line 15 and the first ground line 12, respectively.

$$V1 = r1v \times (Iak + Im) \quad (1)$$

$$V2 = r2v \times Im \quad (2)$$

$$V3 = Vd - [r1v \times (Iak + Im) + r2v \times Im] \quad (3)$$

In order for the surge withstand voltage Vbm of the nonvolatile memory 3 not to be exceeded, the lower limit of the parasitic resistance r1 of the common ground line 15 can be calculated from the condition that the voltage V3 applied between the both terminals of the nonvolatile memory 3 does not exceed the surge withstand voltage Vbm of the nonvolatile memory 3. That condition is: Vbm>the right hand side of formula (3). This inequality is transformed to an inequality that represents directly a condition for the parasitic resistance r1 of the common ground line 15. Thus, in order for the voltage V3 applied between the both terminals of the nonvolatile memory 3 not to exceed the surge withstand voltage Vbm of the nonvolatile memory 3, the parasitic resistance r1 of the common ground line 15 preferably satisfies formula (4) below. Consequently, the IC pattern is so designed that the formula (4) is satisfied by the parasitic resistances r1 and r2 of the common ground line 15 and the first ground line 12, respectively. More specifically, the resistance value of the parasitic resistances r1 and r2 of the common ground line 15 and the first ground line 12, respectively, are preferably designed to satisfy the formula (4) so that the memory cell of the nonvolatile memory 3 nearest to the write terminal 1 is not subjected to a voltage exceeding the surge withstand voltage Vbm of the nonvolatile memory 3.

$$r1v > (Vd - Vbm - r2v \times Im)/(Iak + Im) \quad (4)$$

The breakdown current Iak that flows from the Zener diode 4 to the ground terminal 2 when a surge voltage is applied to the write terminal 1 is a current value in an order of milli-amperes (mA) to amperes (A). On the other hand, the current Im that flows from the nonvolatile memory 3 to the ground terminal 2 when a surge voltage is applied to the write terminal 1 is a current value in an order of microamperes (μA) and is generally a very small value of less than 1/1,000 of the breakdown current Iak. Consequently, the term including the current Im flowing from the nonvolatile memory 3 to the ground terminal 2 in formula (4) can be neglected.

When the term including the current Im flowing from the nonvolatile memory 3 to the ground terminal 2 is eliminated from formula (4), the term including the resistance value r2v of the parasitic resistance r2 of the first ground line 12 can also be neglected, reducing the formula (4) representing the lower limit value of the resistance value r1v of the parasitic resistance r1 of the common ground line 15 to formula (5) below. The formula (5) shows that the resistance value r1v of the parasitic resistance r1 of the common ground line 15 and the breakdown current Iak flowing from the Zener diode 4 to the ground terminal 2 are dominant terms for protecting the nonvolatile memory 3 against a surge voltage in the semiconductor integrated circuit according to the embodiment example. The resistance value r1v of the parasitic resistance r1 of the common ground line 15 can be in the range from 10 ohms per square (10Ω/□) to 100Ω/□.

$$r1v > (Vd - Vbm)/Iak \quad (5)$$

An upper limit value of the resistance value r1v of the parasitic resistance r1 of the common ground line 15 is described here. In order to protect the nonvolatile memory 3 against a surge voltage, it is desired, as described above, to increase the resistance value r1v of the common ground line 15 and decrease the voltage Vd applied to the write terminal 1. However, an upper limit exists actually for a favorable value of the resistance value r1v of the common ground line 15 because of a certain trade-off relationship. More specifically, when the value of the resistance value r1v of the common ground line 15 is increased, the voltage V3 applied to the nonvolatile memory 3 decreases, which raises a problem of degradation of writing performance into the nonvolatile memory 3. Thus, a trade-off relationship exists between surge protection of the nonvolatile memory 3 and writing performance into the nonvolatile memory 3. Thus, the resistance value r1v of the common ground line 15 is preferably designed to satisfy the following formula (6) in order not to degrade the writing performance into the nonvolatile memory 3.

$$r1v < (Vd' - Vwm - r2 \times Im')/(Iak' + Im') \quad (6)$$

In the above formula (6), Vd' represents a writing voltage applied to the write terminal 1, which is a voltage for permitting writing operation into the nonvolatile memory 3. Vwm is a voltage necessary for writing a data into the nonvolatile memory 3. Iak' is the current that flows from the Zener diode 4 to the second ground line 13 when a writing voltage Vd' is applied to the write terminal 1 for the nonvolatile memory 3, in the process of writing into the nonvolatile memory 3. Im' is a current that flows from the nonvolatile memory 3 to the first ground line 12 in the process of writing into the nonvolatile memory 3.

The parasitic resistance r1 of the common ground line 15 is determined at such a value that the writing voltage Vd' applied to the write terminal 1 subtracted by the sum of the voltage drop V1' due to the parasitic resistance r1 of the common ground line 15, which is equal to r1v×(Iak'+Im'), and the voltage drop V2' due to the parasitic resistance r2 of the first ground line 12, which is equal to r2v×Im', is larger than the voltage Vwm that is necessary for writing a data into the nonvolatile memory 3. More specifically, the resistance value of the parasitic resistances r1 and r2 of the common ground line 15 and the first ground line 12, respectively, are designed to satisfy the formula (6) above such that the voltage Vwm necessary for writing a data into the nonvolatile memory 3 is applied to the memory cell at the farthest position of the nonvolatile memory 3 from the write terminal 1.

As described above, the surge withstand voltage of the nonvolatile memory 3 is improved and the writing into the nonvolatile memory 3 is not hindered by designing the resistance value r1v of the parasitic resistance r1 of the common ground line 15 to satisfy both the formulas (6) and (4).

Because a writing voltage applied to the write terminal 1 is generally smaller than the voltage (Vr+r3v×Iak+r1v×(Im+Iak)), breakdown of the Zener diode 4 does not occur in the process of writing into the nonvolatile memory 3. As a consequence, the current Iak' flowing from the Zener diode 4 to the second ground line 13 in the process of writing into the nonvolatile memory 3 is very small value in an order of nano-amperes (nA). More specifically, the current Iak' that flows from the Zener diode 4 to the second ground line 13 in the process of writing into the nonvolatile memory 3 is generally less than 1/1,000 of the current Im' that flows from the nonvolatile memory 3 to the first ground line 12 in the process of writing into the nonvolatile memory 3. Thus, the term in the formula (6) including the current Iak' flowing from the Zener diode 4 to the second ground line 13 can be neglected. Consequently, the resistance value r1v of the parasitic resistance r1 of the common ground line 15 can be determined to satisfy the following formula (7).

$$r1v < (Vd' - Vwm - r2v \times Im')/Im' \qquad (7)$$

Figure 4:
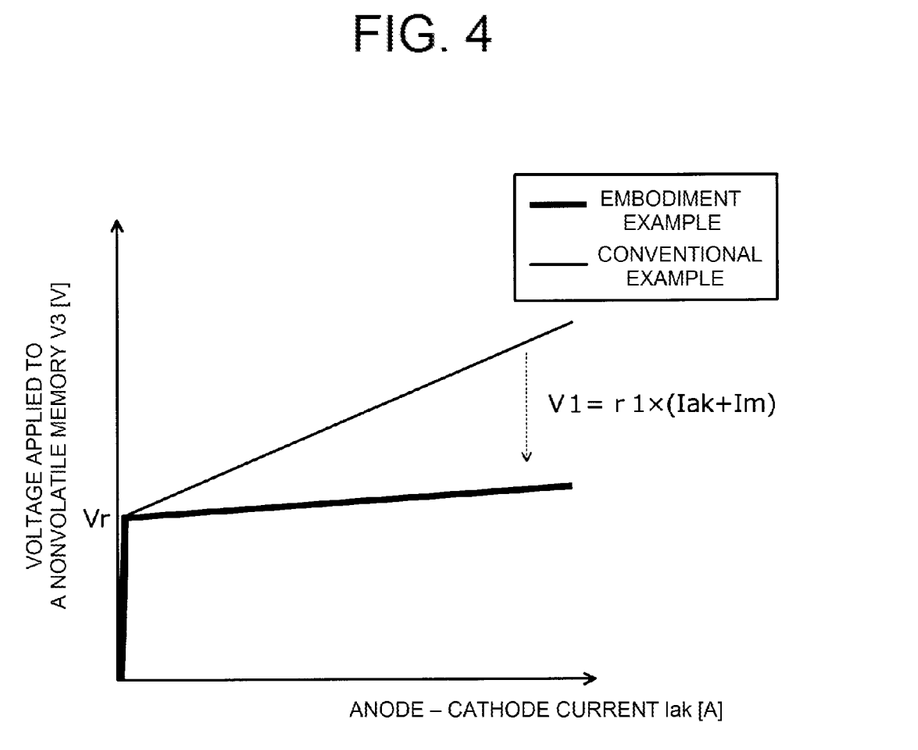
FIG. 4 shows a voltage-current characteristic of a semiconductor integrated circuit according to an embodiment of the present invention.

Next, a description is made about the relationship between the anode-cathode current Iak through the Zener diode 4 and the voltage V3 across the nonvolatile memory 3 when a voltage Vd is applied to the write terminal 1. FIG. 4 shows a voltage-current characteristic of a semiconductor integrated circuit according to an embodiment of the present invention. FIG. 4 also shows the voltage-current characteristic of the conventional semiconductor integrated circuit depicted in FIG. 6 and FIG. 7 for comparison with the voltage-current characteristic of the semiconductor integrated circuit according to the embodiment example depicted in FIG. 1 and FIG. 2. The abscissa of the FIG. 4 represents the anode-cathode current Iak that flows through the Zener diode 4 when a voltage Vd is applied to the write terminal 1. The ordinate of FIG. 4 represents the voltage V3 applied across the nonvolatile memory 3 when a voltage Vd is applied to the write terminal 1.

As shown in FIG. 4, in the conventional semiconductor integrated circuit, the voltage V3 applied across the nonvolatile memory 103 is approximately equal to the voltage Vd applied to the write terminal 101. As a result, when the Vd applied to the write terminal 101 exceeds the voltage (Vr+r3v×Iak+r1v×(Im+Iak)), the voltage V3 across the nonvolatile memory 103 increases in proportion to the increment of the anode-cathode current Iak of the Zener diode 104, or in proportion to the increment of the voltage Vd applied to the write terminal 101.

In the semiconductor integrated circuit according to the embodiment of the invention, in contrast, the voltage V3 applied across the nonvolatile memory 3 is approximately equal to the voltage Vd applied to the write terminal 1 subtracted by the voltage drop V1=r1v×(Iak+Im) due to the parasitic resistance of the common ground line 15. Therefore, even though the voltage Vd applied to the write terminal 1 exceeds the breakdown voltage Vr of the Zener diode 4, the voltage V3 across the nonvolatile memory 3 is maintained approximately at the breakdown voltage Vr of the Zener diode 4.

Figure 5:
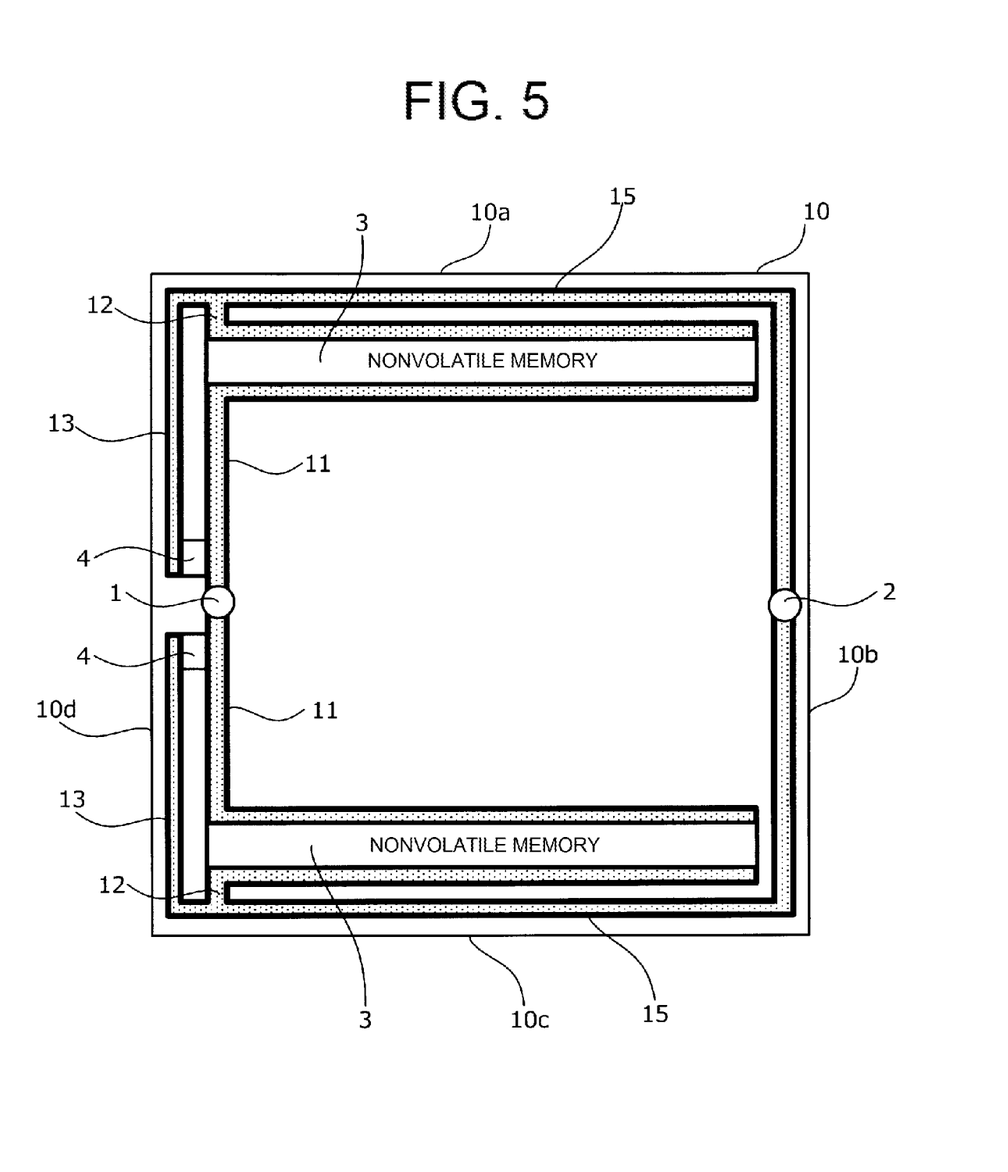
FIG. 5 is a plan view showing an example of whole construction of an IC pattern of a semiconductor integrated circuit formed on a semiconductor chip according to an embodiment of the present invention.

The following describes an example of whole construction of an IC pattern of a semiconductor integrated circuit formed on a semiconductor chip, in which two nonvolatile memories 3 are arranged on the semiconductor chip. FIG. 5 is a plan view showing an example of whole construction of an IC pattern of a semiconductor integrated circuit formed on a semiconductor chip according to an embodiment of the present invention. As shown in FIG. 5, each of the two nonvolatile memories 3 is arranged in the vicinity of the periphery of a rectangular semiconductor chip 10 along a first side 10a and a third side 10c opposite to each other of the semiconductor chip 10. Each of a write terminal 1, which is a write pad, and a ground terminal 2, which is a ground pad, is arranged in the vicinity of the periphery of the semiconductor chip 10 in the opposing second side 10b and fourth side 10d where the two nonvolatile memories 3 are not arranged. Two Zener diodes 4 are arranged along the fourth side 10d of the semiconductor chip 10 interposing the write terminal 1 therebetween.

A second ground line 13 and a common ground line 15 of a first ground line 12 and the second ground line 13 are drawn around in the outer peripheral place than the nonvolatile memory 3 and the Zener diode 4 along the first, second, third and fourth sides 10a, 10b, 10c and 10d of the semiconductor chip 10 from the ground terminal 2 to the Zener diode 4. The common ground line 15 is arranged along the first, second and third sides 10a, 10b and 10c of the semiconductor chip 10 where the ground terminal 2 and the nonvolatile memories 3 are disposed, not in contact with the nonvolatile memories 3. The portion of the second ground line 13 excluding the part of the common ground line 15 is arranged along the fourth side 10d of the semiconductor chip 10 in continuation to the common ground line 15. The second ground line 13 is arranged in contact with the Zener diode 4 at the outside of the Zener diode 4.

The part of the first ground line 12 excluding the common ground line 15 is arranged in a shape of the letter L consisting of a straight line portion disposed along the outside of the nonvolatile memory 3 and in contact with the nonvolatile memory 3 and another straight line portion extending at right angle to the first straight line portion and connecting to the common ground line 15. A write terminal line 11 is drawn around from the write terminal 1 through the Zener diode 4 to the nonvolatile memory 3, in contact with the insides of the Zener diode 4 and the nonvolatile memory 3. The write terminal line 11 is arranged in a shape of the letter L consisting of a straight line portion disposed from the write terminal 1 contacting the inside of the Zener diode 4 reaching the nonvolatile memory 3, and another straight line portion disposed extending in the direction at right angle to the first straight line portion along the inside of the nonvolatile memory 3.

As described thus far, in the embodiment example of the invention, a portion of the first ground line connecting the nonvolatile memory to the ground terminal, and a portion of the second ground line connecting the Zener diode and the ground terminal are merged together into a common ground line. In this construction, the voltage applied to the nonvolatile memory when a surge voltage is applied to the write terminal becomes the magnitude of the surge voltage applied to the write terminal subtracted by the voltage drop generated in the common ground line. Thus, the voltage applied to the nonvolatile memory is restricted even though a surge voltage is applied to the write terminal, preventing the data stored in the nonvolatile memory from being erased by the surge voltage. Further, the nonvolatile memory is saved from destruction by the surge voltage.

The common ground line 15 consisting of a portion of the first ground line 12 and a portion of the second ground line 13 in the embodiment of the invention enhances the surge withstand voltage with little increase in the area of a protection device and a ground line. Thus, increase in the chip area can be avoided, improving the trade-off relationship between enhancement of the surge withstand voltage and reduction of the chip area. The embodiment of the invention having the common ground line composed of a portion of the first ground line and a portion of the second ground line obviates the necessity of manufacturing processes for enhancing the withstand voltage of device elements used in a semiconductor integrated circuit and for avoiding surge current flow through a parasitic current path, which are required in conventional semiconductor integrated circuits. Consequently, manufacturing cost can be held low. Furthermore, a semiconductor integrated circuit can be made with a fine structure and a small area.

The present invention is not limited to the embodiment described thus far, but any variation and modification are possible within the spirit and scope of the invention For example, arrangement of the nonvolatile memory, Zener diode, and terminals and interconnecting wiring lines can be varied corresponding to design conditions, as long as an IC pattern has a common ground line composed of a portion of the first ground line from the nonvolatile memory to the ground terminal and a portion of the second ground line from the Zener diode to the ground terminal. The embodiment described thus far uses a Zener diode 4 for a protection device for protecting the nonvolatile memory against a surge voltage or an overvoltage. However, the Zener diode can be replaced by a MOSFET or a bipolar transistor. Although the embodiment example has a construction to protect the drain of a nonvolatile memory, the present invention can be applied to a construction to protect the gate of the nonvolatile memory.

A semiconductor integrated circuit of the present invention is useful in devices for vehicles, medical equipment, and industrial plant, and especially favorable for semiconductor integrated circuits provided with a nonvolatile memory such as an EPROM or an EEPROM.

It should be understood, however, that the invention is not necessarily limited to the specific arrangement and components shown and described above, but may be susceptible to numerous variations within the scope of the invention.

What is claimed is:

1. A semiconductor integrated circuit comprising:
   a write terminal to which a specified voltage is applied;
   a ground terminal to which a ground potential is applied;
   a nonvolatile memory circuit that is connected between the write terminal and the ground terminal and stores a specified data by performing a writing operation based on the specified voltage;
   a protection device that is connected between the write terminal and the ground terminal in parallel with the memory circuit, and protects the memory circuit against an overvoltage;
   a first ground line that connects a specified connection point and the memory circuit;
   a second ground line that connects the specified connection point and the protection device; and
   a common ground line that connects the ground terminal and the specified connection point;
   wherein a resistance value $r1v$ of a parasitic resistance $r1$ of the common ground line satisfies an inequality:

$$r1v > (Vd - Vbm)/Iak$$

where $Vd$ is the specified voltage applied to the write terminal, $Vbm$ is a breakdown voltage of the memory circuit, and $Iak$ is a current that flows from the protection device to the second ground line when the overvoltage is applied to the write terminal.

2. The semiconductor integrated circuit according to claim 1, wherein
   the resistance value $r1v$ of the parasitic resistance $r1$ of the common ground line satisfies an inequality:

$$r1v > (Vd - Vbm - r2v \times Im)/(Iak + Im)$$

where $Im$ is a current that flows from the memory circuit to the first ground line when the overvoltage is applied to the write terminal, and $r2v$ is a resistance value of a parasitic resistance $r2$ of a part of the first ground line from the memory circuit to the specified connection point.

3. The semiconductor integrated circuit according to claim 1, wherein the resistance value $r1v$ of the parasitic resistance $r1$ of the common ground line satisfies an inequality:

$$r1v < (Vd' - Vwm - r2v \times Im')/Im'$$

where $Vd'$ is a write voltage for permitting writing operation into the memory circuit applied to the write terminal, $Vwm$ is a voltage necessary to write into the memory circuit, $Im'$ is a current that flows from the memory circuit to the first ground line when the write voltage is applied to the write terminal, and $r2v$ is a resistance value of a parasitic resistance $r2$ of a portion from the memory circuit to the specified connection point of the first ground line.

4. The semiconductor integrated circuit according to claim 3, wherein the resistance value $r1v$ of the parasitic resistance $r1$ of the common ground line satisfies an inequality:

$$r1v < (Vd' - Vwm - r2v \times Im')/(Iak' + Im')$$

where $Iak'$ is a current that flows from the protection device to the second ground line when the write voltage is applied to the write terminal.

5. The semiconductor integrated circuit according to claim 1, wherein the protection device includes a Zener diode.

6. The semiconductor integrated circuit according to claim 1, wherein the protection device includes a MOSFET transistor.

7. The semiconductor integrated circuit according to claim 1, wherein the protection device includes a bipolar transistor.

* * * * *